(12) United States Patent
Hsu et al.

(10) Patent No.: US 6,882,223 B2
(45) Date of Patent: Apr. 19, 2005

(54) MULTI-BAND LOW NOISE AMPLIFIER

(75) Inventors: June-Ming Hsu, Hsinchu (TW);
Ming-Ching Kuo, Hsinchu (TW);
Shin-Fu Chen, Hsinchu (TW);
Tz-Heng Fu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 18 days.

(21) Appl. No.: 10/687,580

(22) Filed: Oct. 20, 2003

(65) Prior Publication Data

US 2004/0246051 A1 Dec. 9, 2004

(30) Foreign Application Priority Data

Jun. 5, 2003 (TW) ......................... 92115220 A

(51) Int. Cl.[7] ................................................ H03F 3/45
(52) U.S. Cl. ....................................... 330/252; 330/254
(58) Field of Search ................................ 330/252, 254, 330/261, 295, 124 R, 302

(56) References Cited

U.S. PATENT DOCUMENTS

| | | | | |
|---|---|---|---|---|
| 4,172,238 A | * | 10/1979 | Kusakabe | .................. 330/259 |
| 5,587,689 A | * | 12/1996 | Bowers | .................. 330/254 |
| 5,815,039 A | * | 9/1998 | Kimura | .................. 330/252 |
| 6,404,263 B1 | * | 6/2002 | Wang | .................. 327/359 |

* cited by examiner

Primary Examiner—Henry Choe
(74) Attorney, Agent, or Firm—Bacon & Thomas PLLC

(57) ABSTRACT

A multi-band low noise amplifier comprising: a plurality of matching networks, a plurality of differential pairs, a pair of common base transistors, a pair of inductors, a pair of variable capacitors, a pair of inductors and a current generator. Bases of said plurality of differential pairs are coupled to outputs of said plurality of input matching networks. Emitters and collectors of said plurality of differential pairs are connected. Emitters of said common base transistor pairs are coupled to collectors of said plurality of differential pairs. The inductors are coupled to collectors of said common base transistor and a power supply. The capacitors and the inductors form a resonator pair. The inductors are coupled to emitters of said plurality of differential pairs. The inductor pairs are interlinked. The current generators are coupled to a coupling point of said inductors and to ground.

14 Claims, 8 Drawing Sheets

MULTI-BAND LOW NOISE AMPLIFIER

BACKGROUND OF THE INVENTION

The present invention generally relates to a circuit used in wireless communication systems, and more particularly pertains to a technology used in a multi-band low noise amplifier.

Multi-mode and multi-band receivers are important applications in recent development of wireless communication systems. A multi-mode receiver is capable of processing signals defined by various communication protocols, such as WCDMA protocol and GSM protocol. A multi-band receiver is capable of processing signals, which falls in various ranges of frequency bands. For example, a receiver included in a dual-band mobile phone is a typical multi-band receiver, which is capable of processing signals of 1.8 GHz and 900 MHz frequency bands. The frequency bands of signal to be processed by next generation WCDMA/GSM dual-mode receivers are 2.1 GHz, 1.9 GHz, 1.8 GHz and 900 MHz.

At present, wireless communication systems such as a treble band mobile phone, which comprises functions of PCS (GSM-1900 frequency band applied), DCS (adapt GSM-1800 frequency band applied) and GSM900 (adapt GSM900 frequency band applied), utilize several low noise amplifiers for processing multi-band signals. In such a treble band mobile phone, there are three low noise amplifiers applied in the RF chipsets included in the phone for receiving and configuring signals of three frequency bands, 1.9 GHz, 1.8 GHz and 900 MHz. It is considered to a feasible solution to integrate front-end components such as low noise amplifier and voltage controlled oscillator into RF chipsets for reducing the cost and simplifying the architecture of the RF chipsets. However, such integration may cause noise leakage from other circuits to the low noise amplifier and result in low signal quality. There are several solutions devised to overcome the problem and fully-differential circuit architecture is one of those solutions.

FIG. 1 illustrates a prior art fully-differential circuit applied in a low noise amplifier. The amplifier is a fully-differential circuit comprising: a differential pair 11, a common base transistor pair 12, a degenerating inductor pair 13, a load inductor pair 14, a current generator 15, and a matching network (not shown in the diagram). In the prior art, a fully-differential signal comes from an antenna going through the matching network, flows into the low noise amplifier, then output from collector of the common base transistor pair 12.

The advantages of the architecture are: (1) the impedance observed in base of the differential pair 11 is transferred to that required by the previous stage (usually is a band pass filter) by implementing degenerating inductor pair and input matching network so as to a power matching and a noise matching are accomplished, (2) the DC voltage across the load is reduced by applying load inductor, by doing so, not only required voltage is reduced and the linearity is enhanced, and (3) the working frequency of the circuit is increased by assigning appropriate load inductor for compensating parasitic capacitance of the output. On the other hand, the drawbacks of the architecture are: (1) inductors take up large area in a circuit, and (2) the architecture is better suited in narrow band applications. In other words, such a single low noise amplifier cannot be used for processing multi-band signals in a multi-band receiver.

Therefore, in the implementation of a multi-band receiver, several low noise amplifiers are required. But, those low noise amplifiers take up a large area in the circuit. For example, the central frequency of WCDMA and DCS wireless communication systems is 2.14 GHz and 1.84 GHz respectively. There is a 300 MHz difference between two. As a result, if one chooses to apply one low noise amplifier illustrated in FIG. 1 for processing signals of two frequency bands, then the return loss and the noise figure are not acceptable for both bands simultaneously. Or, if one chooses to apply two low noise amplifier illustrated in FIG. 1 for processing signals of two frequency bands, then it means eight on-chip inductors will be required in two amplifiers and the cost of the product will accordingly increase.

Therefore, a new circuit architecture is needed, where components on the circuit can be shared without sacrificing the performance of the circuit so as to reduce the cost of a multi-band receiver. Solutions to overcome aforementioned problem are disclosed in several patents. In the U.S. Pat. No. 6,134,427, a control signal switch in a matching network 21 is applied for determining whether capacitor 23 and inductor 24 should function so as to generate a matching network 21 applicable for dual band signal processing. In the U.S. Pat. No. 5,995,814, an input matching network is utilized in the patented technology, where capacitor 32, 33 and inductor 34, 35 are used for ensuring the return loss for the dual frequency bands are in accordance with the specification of the communication protocol.

A low noise amplifier requires a large amount of on-chip inductors. A fully-differential circuit may require up to four on-chip inductors. At present, the area of an inductor may account up to 150 $\mu$m*150 $\mu$m, which explains the fact that utilizing several low noise amplifiers on a single chip does not only occupy a large area on the chip, also it results in the increase of the chipset cost. Therefore, it is desirable to find a solution resolving problems caused by the fact that an overly large area is taken up by inductors in the design of low noise amplifiers.

SUMMARY OF THE INVENTION

In order to resolve problems caused by the fact that an overly large area is taken up by inductors in the design of low noise amplifiers, the present invention provides a low noise amplifier for receiving broad frequency bands where the area taken up by the inductors is reduced. Therefore, the main objective of the present invention is to provide a multi-band low noise amplifier where area taken up by inductors and product cost is reduced.

Another objective of the present invention is to provide a multi-band low noise amplifier comprising: a plurality of matching networks, a plurality of differential pairs, a pair of common base transistors, a pair of inductors, a pair of variable capacitors, a pair of inductors and a current generator. A plurality of matching networks is used for receiving input signals from a plurality of frequency bands respectively. Bases of said plurality of differential pairs are coupled to outputs of said plurality of input matching networks. Emitters and collectors of said plurality of differential pairs are connected together, respectively. Emitters of said common base transistor pairs are coupled to collectors of said plurality of differential pairs. One end of the inductor pairs is coupled to collectors of said common base transistor pair and the other end is coupled to a power supply. One end of said inductor pairs is coupled to emitters of said plurality of differential pairs, and the other end of said inductor pairs is interlinked. One end of the current generator is coupled to a coupling point of said inductors, and the other end of the current generator is coupled to ground.

A current flows through a predetermined kth differential pair and only the predetermined kth differential pair is switched on and the rest of the differential pairs are switched off when the frequency band of a received signal falls in the range of the predetermined kth frequency band. The capacitor pair and the inductor pair form a resonator pair. When the frequency band of a received signal falls in the range of a predetermined kth frequency band, variable capacitance value is adapted to ensure the resonance frequency of the resonator is equal to the central frequency of the predetermined kth frequency band. Sharing the inductors used in the multi-band low noise amplifier reduces the area and cost of the chipsets.

DETAILED DESCRIPTION OF THE PREFERRED EMBODIMENTS

Figure 1:
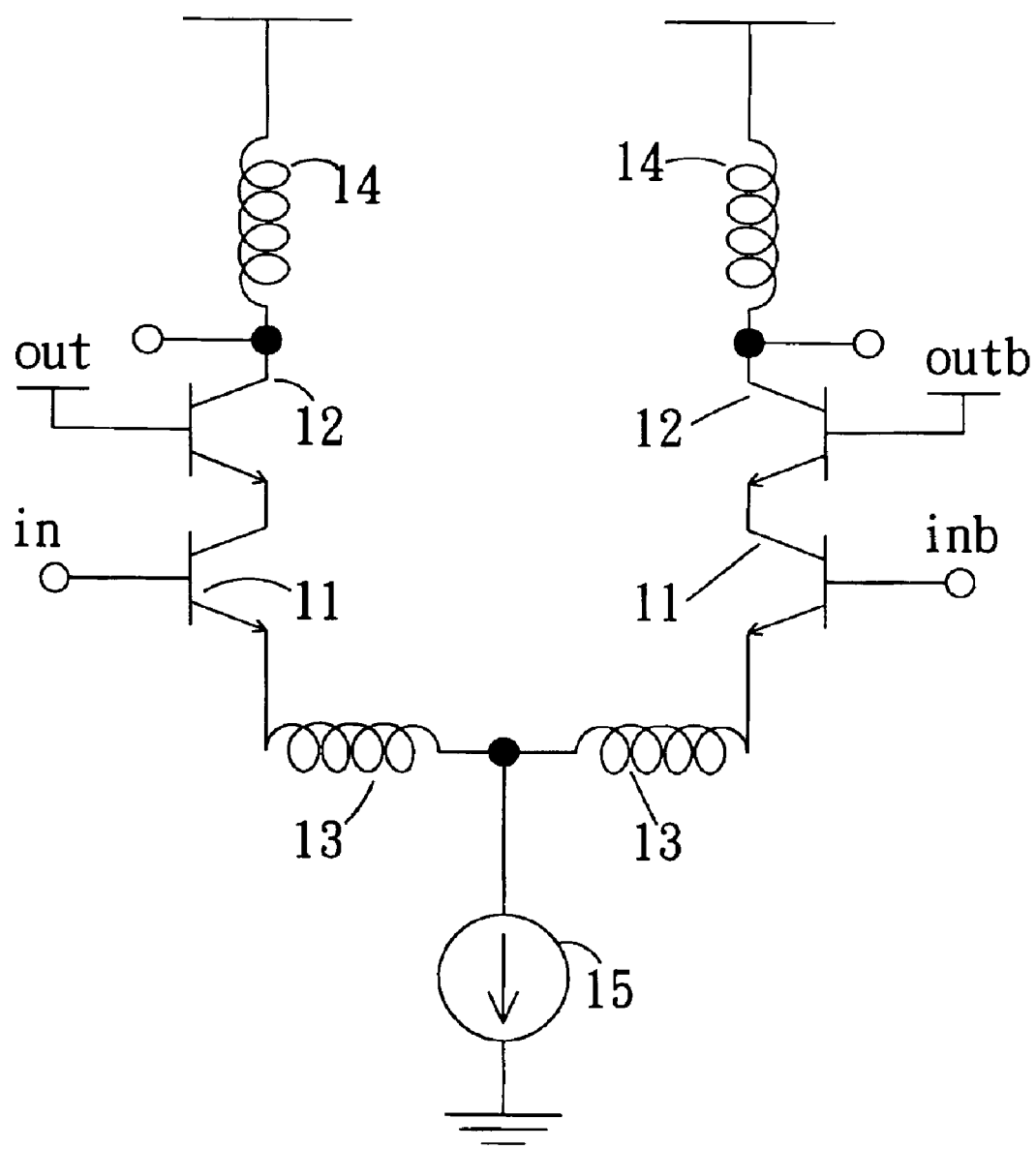
FIG. 1 is a circuit diagram illustrating a prior art low noise amplifier.
Figure 2:
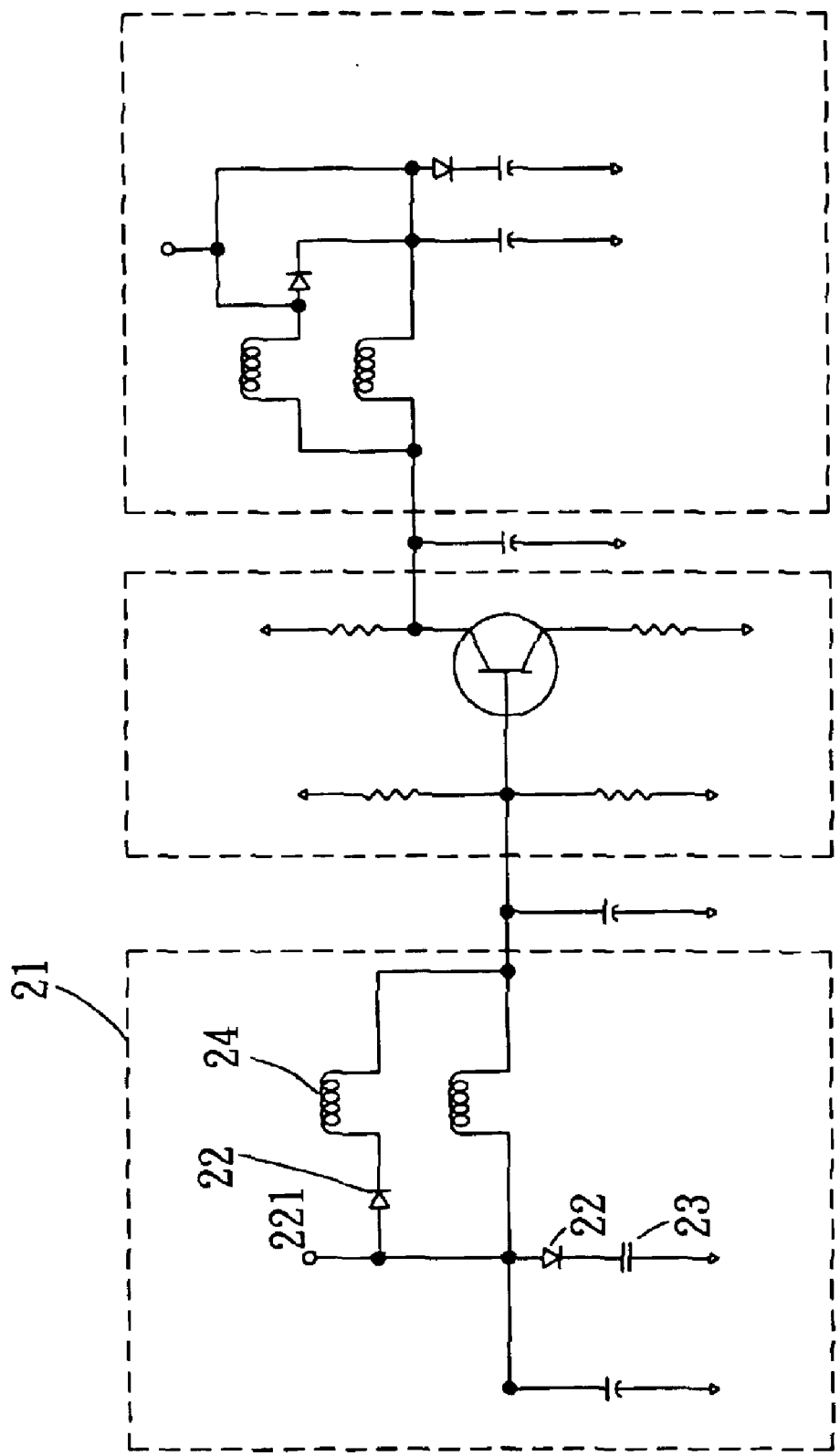
FIG. 2 is a circuit diagram illustrating a matching network for a prior art low noise amplifier.
Figure 3:
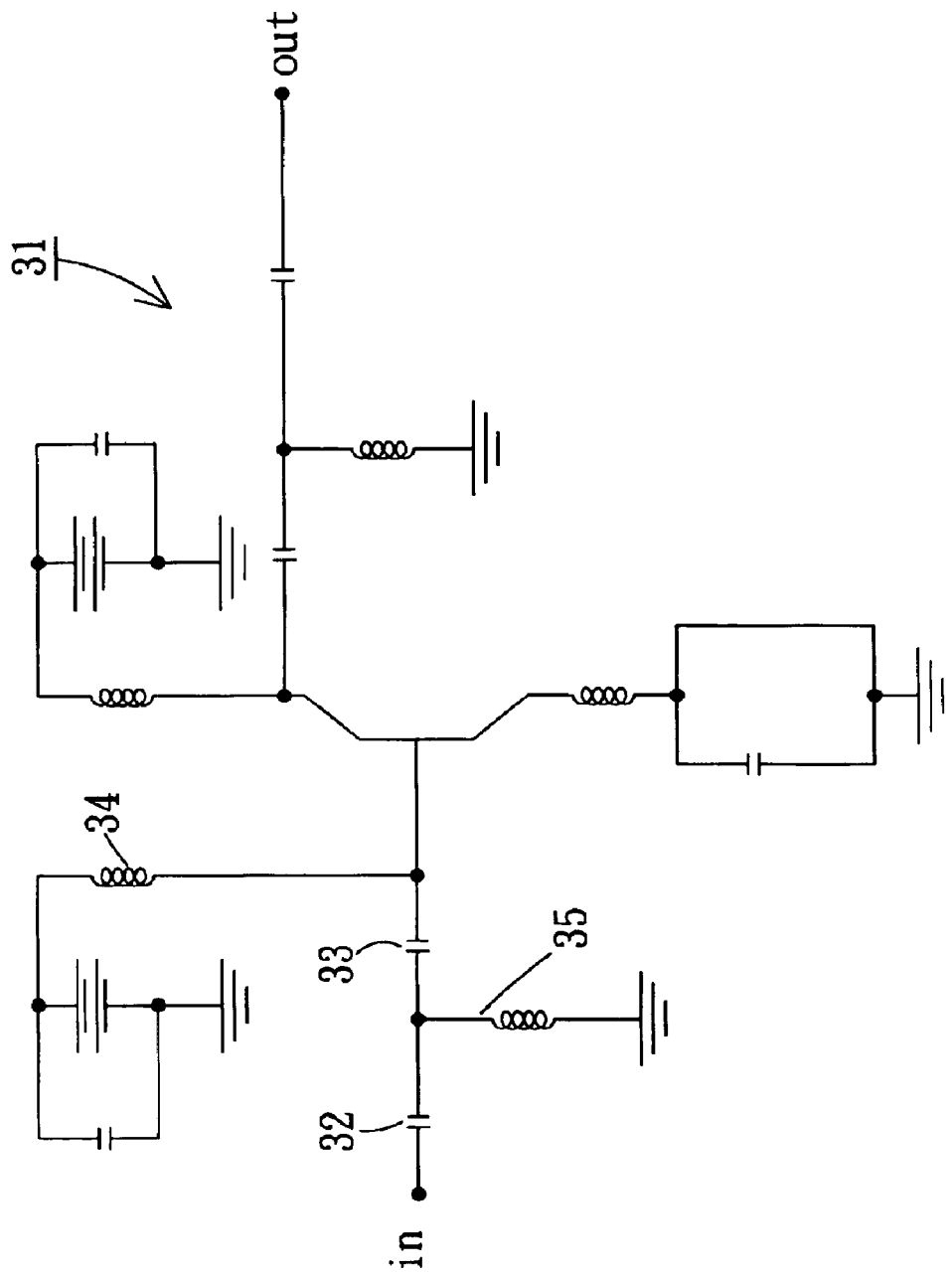
FIG. 3 is a circuit diagram illustrating another matching network for a prior art low noise amplifier.
Figure 4:
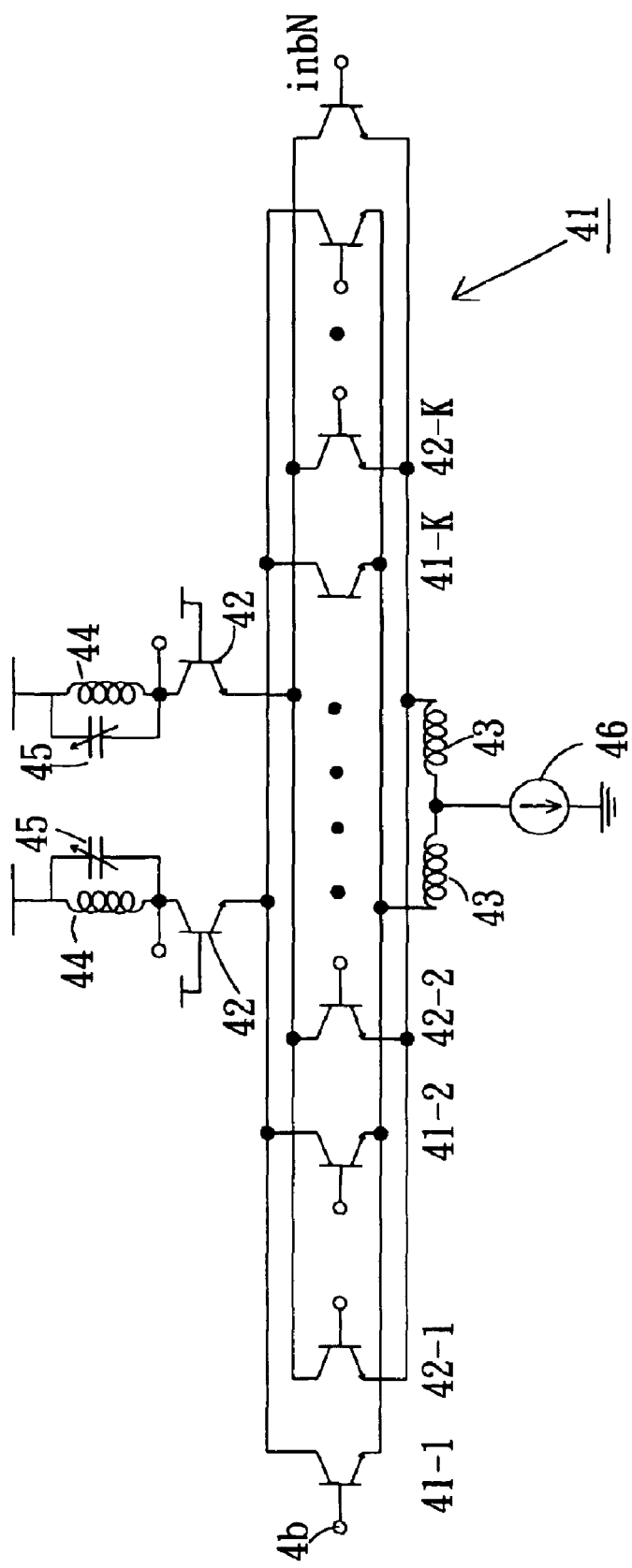
FIG. 4 is a schematic circuit diagram illustrating a low noise amplifier according to the present invention.

The present invention discloses a multi-band low noise amplifier. Refer to FIG. 4, the schematic circuit diagram shown illustrates a low noise amplifier according to the present invention. In order to reduce the area taken up by inductors in the design of a multi-band low noise amplifier, the architecture adapted in a multi-band low noise amplifier unitizes a fully-differential circuit. The fully-differential circuit has N differential pairs (41-1~14-N, 42-1~42-N), a common base transistor pair 42, a degenerating inductor pair 43, a load inductor pair 44, a variable capacitor pair 45, a current generator 46, and a plurality of matching networks (not shown in FIG. 4). The load inductor pair and the variable capacitor pair form a resonator pair. In such configuration, corresponding differential pairs (41-~41-N, 42-1~42-N) receive signals of different frequency bands, but degenerating inductors 43 are shared in the operation of signal processing. When a receiver receives a signal falling in the range of a predetermined kth frequency band, only the predetermined kth differential pair (41-k, 42-k) is switched on and the rest of the differential pairs are switched off. Besides, all frequency bands share the same load inductor 44. At the same time, a variable capacitor 45 is incorporated for adjusting the resonance frequency of a resonator. When the amplifier processes the signal of kth frequency band, the central frequency of the kth frequency band is equal to the resonance frequency of a resonator. The advantages of such architecture are:

(1) When a low noise amplifier is applied in receiver capable of processing signals of N frequency bands, 4*N inductors required previously are now reduced to 4 and the area taken up by inductors is reduced to 1/N of the area taken up previously.

(2) By assigning appropriate transistors, DC current level and input matching networks, the performance of signal processing for each frequency band is optimized.

(3) Due to the fact that only the predetermined kth differential pair is switched on and the rest of the differential pairs are switched off when a receiver receives a signal falling in the range of a predetermined kth frequency band, these differential pairs being switched off only generate minor parasitic capacitance and have minor effect on the performance of the circuit.

(4) When the receiver is designed for processing multi-band signals, signals of different frequency bands require corresponding band pass filter for signal processing, which means that an extra switch for assigning band pass filter may be needed. Such switch results in an increase of the cost; also it may cause an increase of the noise figure and a decrease of the noise gain. However, because only kth differential pair is switched on, and the rest of the differential pairs are switched off, the switch for assigning band pass filter is not needed according to the present invention. Therefore, the cost of the hardware is reduced.

Figure 5:
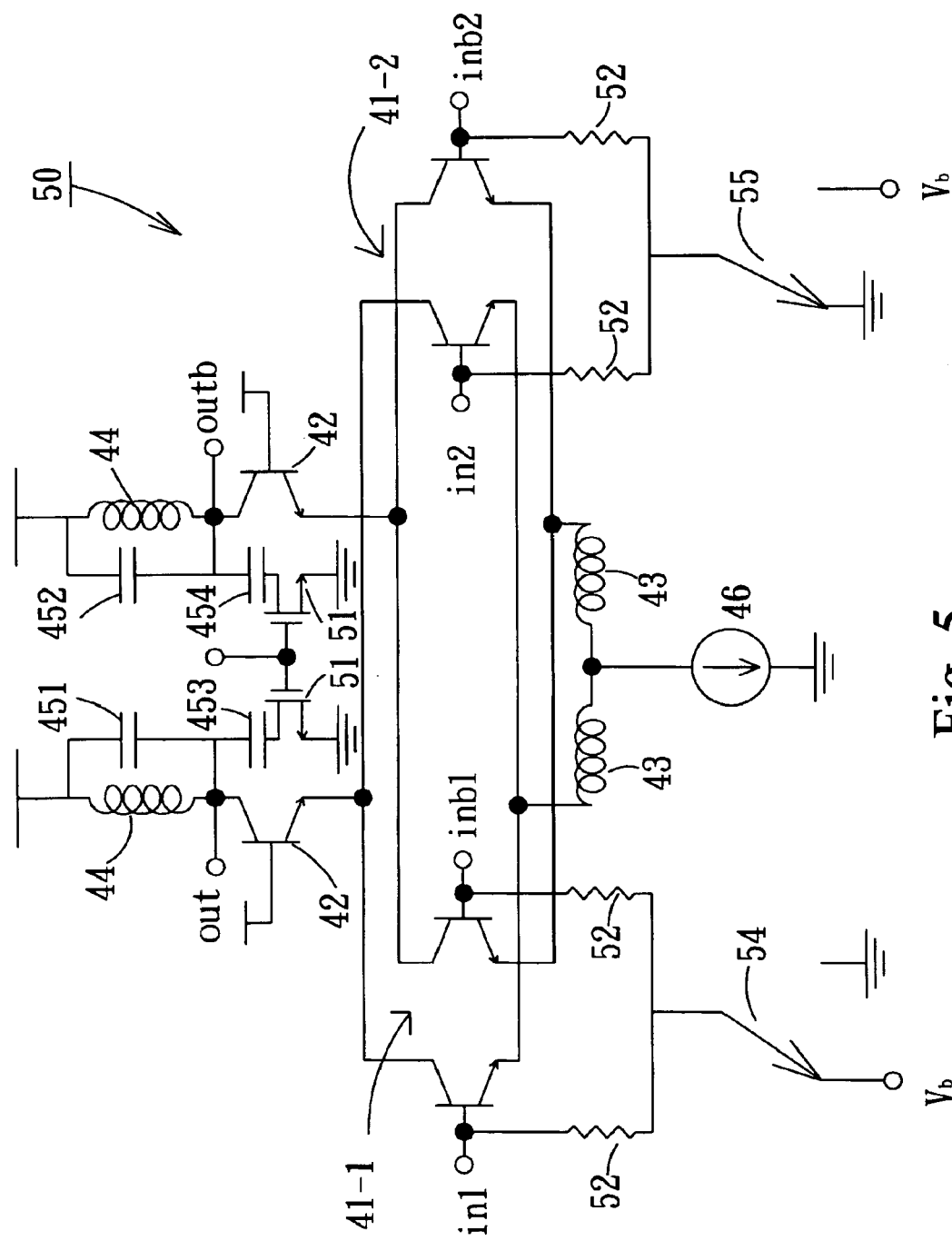
FIG. 5 is a partial circuit diagram illustrating a low noise amplifier according an embodiment of the present invention.

FIG. 5 is a partial circuit diagram illustrating a low noise amplifier according an embodiment of the present invention. In the embodiment, the receiver is designed to process signals of dual frequency bands. The amplifier is a fully-differential circuit comprising: two differential pairs 41-1 and 41-2, a common base transistor pair 42, a degenerating inductors 43, a load inductor pair 44, four capacitors 451, 452, 453 and 454, a set of MOS switches 41, a current generator 46, four bias resistors 52 and two sets of input matching networks (not shown in FIG. 5, refer to FIG. 6). In the embodiment illustrated in FIG. 5, the transistor is selected from a group consisting of a bipolar junction transistor, a MOS transistor and equivalents.

In the same embodiment, the working frequency for the first frequency band is higher than the working frequency for the second frequency band. When a receiver receives a signal of the first frequency band, a control signal BAND then switches the switches 54 and 55 to the left. Accordingly, base voltage of the transistor of the first differential pair 41-1 is coupled to Vb and the differential pair 41-1 is then switched on, at the same time base voltage of the transistor of the second differential pair 41-2 is coupled to GND and the differential pair 41-2 is then switched off. It follows that the current 46 flows completely to the transistor of the first differential pair 41-1. When the current loading occurs, the signal BAND then has the MOS switch 51 switched off. The resonance frequency on the loading end is determined by components 451 and 44. The resonance frequency is $\omega_1 = 1/(C1*L1)^{0.5}$, where C1 is the capacitance value of capacitor 451, L1 is the inductance value of the inductor 44 and $\omega_1$ is the central frequency of the first frequency band.

Or, when the receiver receives a signal of the second frequency band, a control signal BAND then switches the switches 54 and 55 to the right. Accordingly, base voltage of the transistor of the second differential pair 41-2 is coupled to Vb and the differential pair 41-1 is then switched on, at the same time base voltage of the transistor of the first differential pair 41-1 is coupled to GND and the differential pair 41-1 is then switched off. It follows that the current 46 flows completely to the transistor of the second differential pair 41-2. When the current loading occurs, the signal BAND then has the MOS switch 51 switched on. The resonance frequency on the loading end is determined by components 451, 453 and 44. The resonance frequency is $\omega 2=1/((C1+C3)*L1)^{0.5}$, where C1 and C3 is the capacitance value of capacitor 451 and 453 respectively, L1 is the inductance value of the inductor 44 and $\omega 2$ is the central frequency of the second frequency band.

Figure 6:
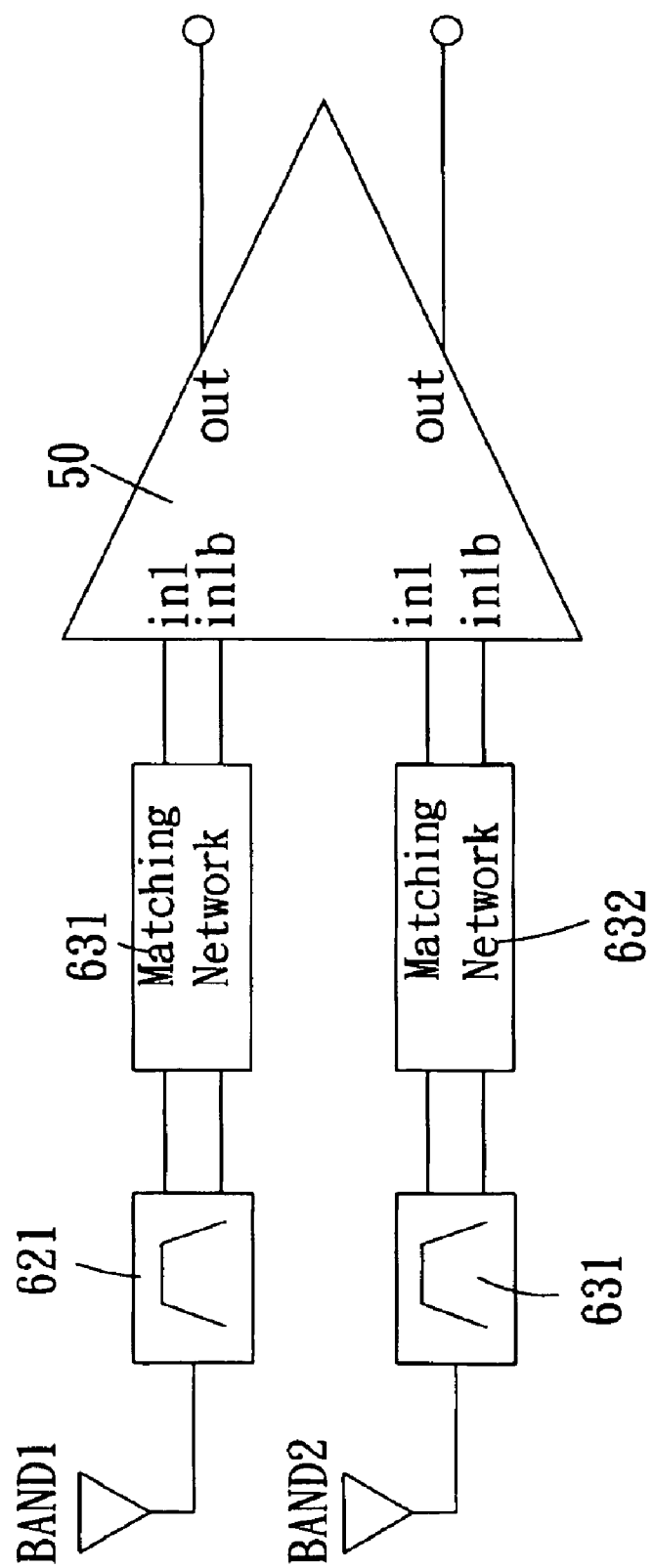
FIG. 6 is a schematic RF circuit diagram illustrating a low noise amplifier according to the present invention.

FIG. 6 is a schematic RF circuit diagram illustrating a low noise amplifier according to the present invention. The fully-differential circuit in the FIG. 6 is based on the architecture of the low noise amplifier shown in the FIG. 5. When an antenna receives a signal of the first band BAND1, the signal flows through a band pass filter 621 for the first band BAND1, the matching network 631 for the first band BAND1, then into the first differential pair 41-1 according to the present invention (shown in FIG. 5). When an antenna receives a signal of the second band BAND2, the signal flows through a band pass filter 622 for the second band BAND2, the matching network 632 for the second band BAND2, then into the second differential pair 41-2 according to the present invention (shown in FIG. 5). The output of the low noise amplifier then flows to the following circuits such as a mixer. Because there is only one pair of differential pair being switched on at one time, the other differential pair being switched off is served as a component to keep the low noise amplifier isolated from the front-end components such as a band pass filter and accordingly prevent the working frequency band from being interfered.

Figure 7:
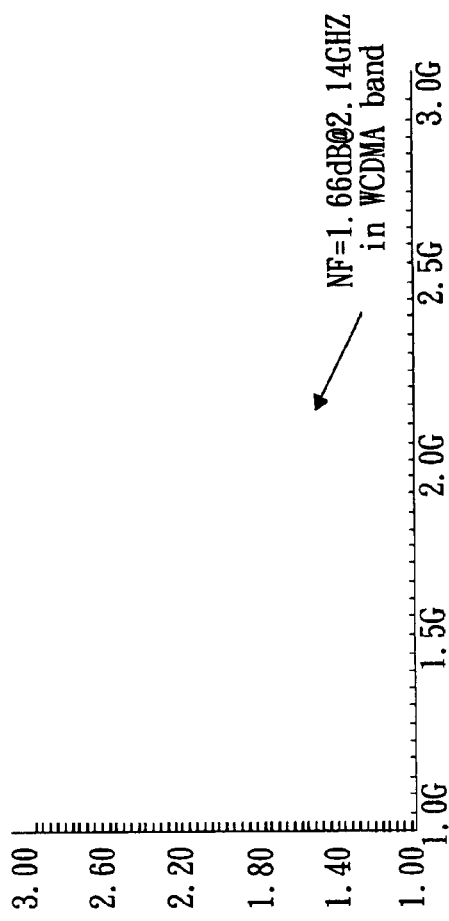
FIGS. 7 and 8 are a diagram indicating return loss measurement of a low noise amplifier according an embodiment of the present invention.
Figure 8:
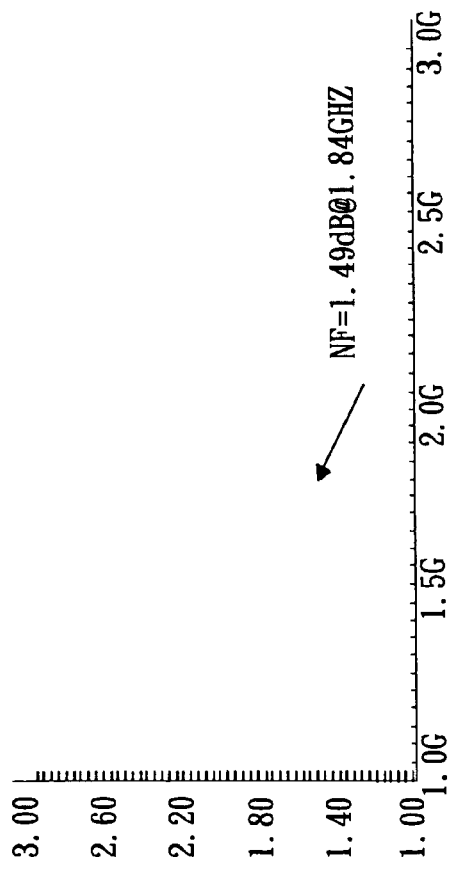
Figure 9:
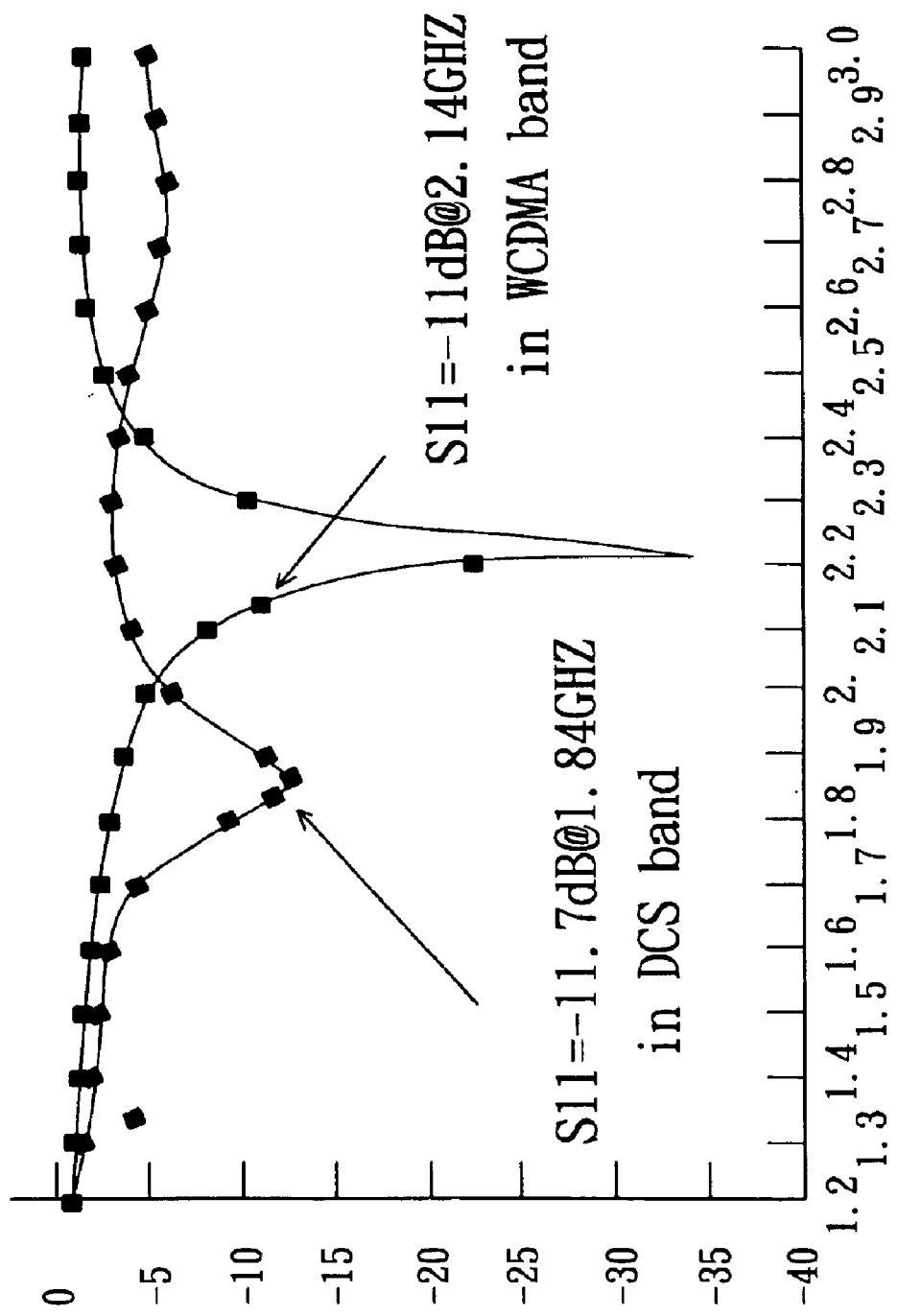
FIG. 9 is a diagram indicating noise figure and gain measurement of a low noise amplifier according an embodiment of the present invention.

FIGS. 7 and 8 are measurements of the low noise amplifier applied in a receiver designed to work on the WCDMA frequency band and DCS frequency band. The working frequency band for WCDMA and DCS is 2.11–2.17 GHz and 1.805–1.88 GHz respectively. The central frequency for WCDMA and DCS has a difference of 300 MHz. SiGe BiCMOS process is used for manufacturing this RF chipsets. FIGS. 7 and 8 are a diagram indicating return loss ($S_{11}$) measurement of a low noise amplifier according an embodiment of the present invention. The return loss S11 measured for receiving signals of WCDMA and DCS frequency bands is −18 and −25 dB respectively. FIG. 9 is a diagram indicating noise figure and voltage gain measurement of a low noise amplifier according an embodiment of the present invention. It should be noted that the noise figure and voltage gain measured in the diagram includes the operation involved with mixers. The voltage gain measured for signals of WCDMA and DCS is both higher than 32 dB, and the noise figure is 5.4 and 4.4 dB respectively. It is clearly indicated in FIGS. 7 and 8 that the measurements of return loss, voltage gain and the noise figure for signals of WCDMA and DCS frequency bands meet the requirements of the wireless communication protocol. FIGS. 7 and 8 proves that the present invention is applicable in the design of a dual-band low noise amplifier, which meets the requirements of the protocol.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. Multi-band low noise amplifier comprising:
   a plurality of matching networks for receiving input signals from a plurality of frequency bands respectively;
   a plurality of differential pairs, bases of said plurality of differential pairs being coupled to outputs of said plurality of input matching networks, emitters and collectors of said plurality of differential pairs are connected together, respectively;
   a pair of common base transistors, emitters of said common base transistor pairs being coupled to collectors of said plurality of differential pairs;
   a first pair of inductors, one end of the inductor pairs being coupled to collectors of said common base transistor pair, the other end being coupled to a power supply;
   a pair of variable capacitors, one end of the variable capacitor pairs being coupled to collectors of said common base transistor pair, the other end being coupled to said power supply;
   a second pair of inductors, one end of said inductor pairs being coupled to emitters of said plurality of differential pairs, the other end of said inductor pairs being interlinked; and
   a current generator, one end of the current generator being coupled to a coupling point of said inductors, the other end of the current generator being coupled to ground.

2. The multi-band low noise amplifier of claim 1, wherein said transistor is selected from a group consisting of a bipolar junction transistor, a MOS transistor and equivalents.

3. The multi-band low noise amplifier of claim 1, wherein only a predetermined kth differential pair is switched on and the rest of the differential pairs are switched off when the frequency band of a received signal falls in the range of a predetermined kth frequency band.

4. The multi-band low noise amplifier of claim 1, wherein the capacitor pair and the first inductor pair form a resonator pair, when the frequency band of a received signal falls in the range of a predetermined kth frequency band, variable capacitance value is adapted to ensure the resonance frequency of the resonator is equal to the central frequency of the predetermined kth frequency band.

5. The multi-band low noise amplifier of claim 1, wherein a current flows through the predetermined kth differential pair when the frequency band of a received signal falls in the range of a predetermined kth frequency band.

6. The multi-band low noise amplifier of claim 1, wherein the multi-band low noise amplifier further comprises a first control signal to control a switch for having the predetermined kth differential pair switched on by having the transistor base voltage coupled to a voltage bias, and at the same time for having the rest of the differential pairs switched off by having the base voltage coupled to ground.

7. A fully-differential circuit comprising:
   a plurality of matching networks for receiving input signals from a plurality of frequency bands respectively;
   a plurality of differential pairs, bases of said plurality of differential pairs being coupled to outputs of said plurality of input matching networks, emitters and collectors of said plurality of differential pairs are connected together, respectively;
   a pair of common base transistors, emitters of said common base transistor pairs being coupled to collectors of said plurality of differential pairs;

a first pair of inductors, one end of the inductor pairs being coupled to collectors of said common base transistor pair, the other end being coupled to a power supply;

a pair of variable capacitors, one end of the variable capacitor pairs being coupled to collectors of said common base transistor pair, the other end being coupled to said power supply; wherein the capacitor pair and the inductor pair form a resonator pair, a second pair of inductors, one end of said inductor pairs being coupled to emitters of said plurality of differential pairs, the other end of said inductor pairs being interlinked; and a current generator, one end of the current generator being coupled to a coupling point of said inductors, the other end of the current generator being coupled to ground.

8. The fully-differential circuit of claim 7, wherein said transistor is selected from a group consisting of a bipolar junction transistor, a MOS transistor and equivalents.

9. The fully-differential circuit of claim 7, wherein a current flows through a predetermined kth differential pair and only the predetermined kth differential pair is switched on and the rest of the differential pairs are switched off when the frequency band of a received signal falls in the range of the predetermined kth frequency band; and variable capacitance value is adapted to ensure the resonance frequency of the resonator is equal to the central frequency of the predetermined kth frequency band.

10. The fully-differential circuit of claim 9, wherein the fully-differential circuit is used in a multi-band low noise amplifier.

11. The fully-differential circuit of claim 7, wherein the multi-band low noise amplifier further comprises a first control signal to control a switch for having the predetermined kth differential pair switched on by having the transistor base voltage coupled to a voltage bias, and at the same time for having the rest of the differential pairs switched off by having the base voltage coupled to ground.

12. A receiver comprising:

at least one antenna for receiving a signal, the signal falls in the range of a predetermined kth frequency band;

at least one filter having a input being coupled to output of said at least one antenna, the filter is used for filtering the received signal falling in the range of the predetermined kth frequency band;

a low noise amplifier having matching networks for receiving input signals from a plurality of frequency bands respectively, a plurality of differential pairs, bases of said plurality of differential pairs being coupled to outputs of said plurality of input matching networks, emitters and collectors of said plurality of differential pairs are connected together, respectively, a pair of common base transistors, emitters of said common base transistor pairs being coupled to collectors of said plurality of differential pairs, a pair of inductors, one end of the inductor pairs being coupled to collectors of said common base transistor pair, the other end being coupled to a power supply, a pair of variable capacitors, one end of the variable capacitor pairs being coupled to collectors of said common base transistor pair, the other end being coupled to said power supply, a second pair of inductors, one end of said second inductor pair being coupled to emitters of said plurality of differential pairs, the other end of said second inductor pair being interlinked; and a current generator, one end of the current generator being coupled to a coupling point of said second inductor pair, the other end of the current generator being coupled to ground; and at least one signal converter having a input being coupled to the output of the low noise amplifier, the signal converter being used for converting the received signal into a intermediate frequency signal;

wherein, a current flows through a predetermined kth differential pair and only the predetermined kth differential pair is switched on and the rest of the differential pairs are switched off when the frequency band of a received signal falls in the range of the predetermined kth frequency band; and variable capacitance value is adapted to ensure the resonance frequency of the resonator is equal to the central frequency of the predetermined kth frequency band.

13. The receiver of claim 12, wherein said transistor is selected from a group consisting of a bipolar junction transistor, a MOS transistor and equivalents.

14. The receiver of claim 12, wherein the multi-band low noise amplifier further comprises a first control signal to control a switch for having the predetermined kth differential pair switched on by having the transistor base voltage coupled to a voltage bias, and at the same time for having the rest of the differential pairs switched off by having the base voltage coupled to ground.

* * * * *